United States Patent
Laing et al.

(10) Patent No.: US 7,299,632 B2
(45) Date of Patent: Nov. 27, 2007

(54) SOLAR ELECTRICITY GENERATOR

(76) Inventors: Nikolaus Johannes Laing, 1253 La Jolla Rancho Rd., La Jolla, CA (US) 92037; William Arthur Parkyn, Jr., 25031 Neko Dr., Lomita, CA (US) 90717; Inge Laing, 1253 La Jolla Rancho Rd., La Jolla, CA (US) 92037

(*) Notice: Subject to any disclaimer, the term of this patent is extended or adjusted under 35 U.S.C. 154(b) by 24 days.

(21) Appl. No.: 10/491,185

(22) PCT Filed: Oct. 9, 2002

(86) PCT No.: PCT/EP02/11309

§ 371 (c)(1),
(2), (4) Date: Sep. 8, 2004

(87) PCT Pub. No.: WO03/034506

PCT Pub. Date: Apr. 24, 2003

(65) Prior Publication Data

US 2005/0028524 A1    Feb. 10, 2005

(30) Foreign Application Priority Data

Oct. 12, 2001  (DE) ................. 101 50 176
Mar. 30, 2002  (DE) ................. 102 14 408

(51) Int. Cl.
*B60K 16/00*  (2006.01)

(52) U.S. Cl. ...................... 60/641.8; 60/615

(58) Field of Classification Search ........... 60/641.8, 60/641.15, 495; 126/565, 698; 136/246, 136/247, 248, 259; 165/45
See application file for complete search history.

(56) References Cited

U.S. PATENT DOCUMENTS

| | | | | |
|---|---|---|---|---|
| 4,159,629 A | * | 7/1979 | Korr et al. ............. | 60/641.15 |
| 4,214,572 A | * | 7/1980 | Gonder ................. | 60/641.15 |
| 4,296,731 A | * | 10/1981 | Cluff .................... | 136/246 |
| 4,315,500 A | * | 2/1982 | Gonder ................. | 126/568 |
| 4,350,143 A | * | 9/1982 | Laing et al. ........... | 136/248 |
| 4,360,004 A | * | 11/1982 | Testolini .............. | 60/641.15 |
| 4,771,764 A | * | 9/1988 | Cluff .................... | 136/246 |
| 5,286,305 A | * | 2/1994 | Laing et al. ........... | 136/246 |
| 5,445,177 A | * | 8/1995 | Laing et al. ........... | 136/246 |
| 5,665,174 A | * | 9/1997 | Laing et al. ........... | 136/246 |
| 5,772,791 A | * | 6/1998 | Laing .................... | 136/246 |
| 6,020,553 A | * | 2/2000 | Yogev ................... | 136/246 |
| 2004/0163697 A1 | * | 8/2004 | Papadopoulos ....... | 136/246 |
| 2004/0187907 A1 | * | 9/2004 | Morgal ................. | 136/246 |

FOREIGN PATENT DOCUMENTS

AU    723841    *  5/1998

OTHER PUBLICATIONS

Das solar marine-Kraftwerk, Laing, Eurosolar (magazine), Feb. 1992, pp. 18-19.*

* cited by examiner

*Primary Examiner*—Hoang Nguyen

(57) ABSTRACT

Disclosed is a floating altazimuth-tracking array of point-focus lenses that concentrate direct sunlight on the upper ends of optical-homogenizer rods bonded to high-efficiency multi-junction photovoltaic cells. The cells are on heat sinks in altitude-tracking linear troughs holding multiple lens-rod-cell assemblies. Swiveling on horizontal axes, the troughs have their heat sinks always submerged in the water of a circular pond. Only knee-high al-together, the troughs and their floating frame rotate in the shallow pond for azimuth tracking. Closely packed floating platforms comprise solar electric farms with maximal land utilization.

31 Claims, 7 Drawing Sheets

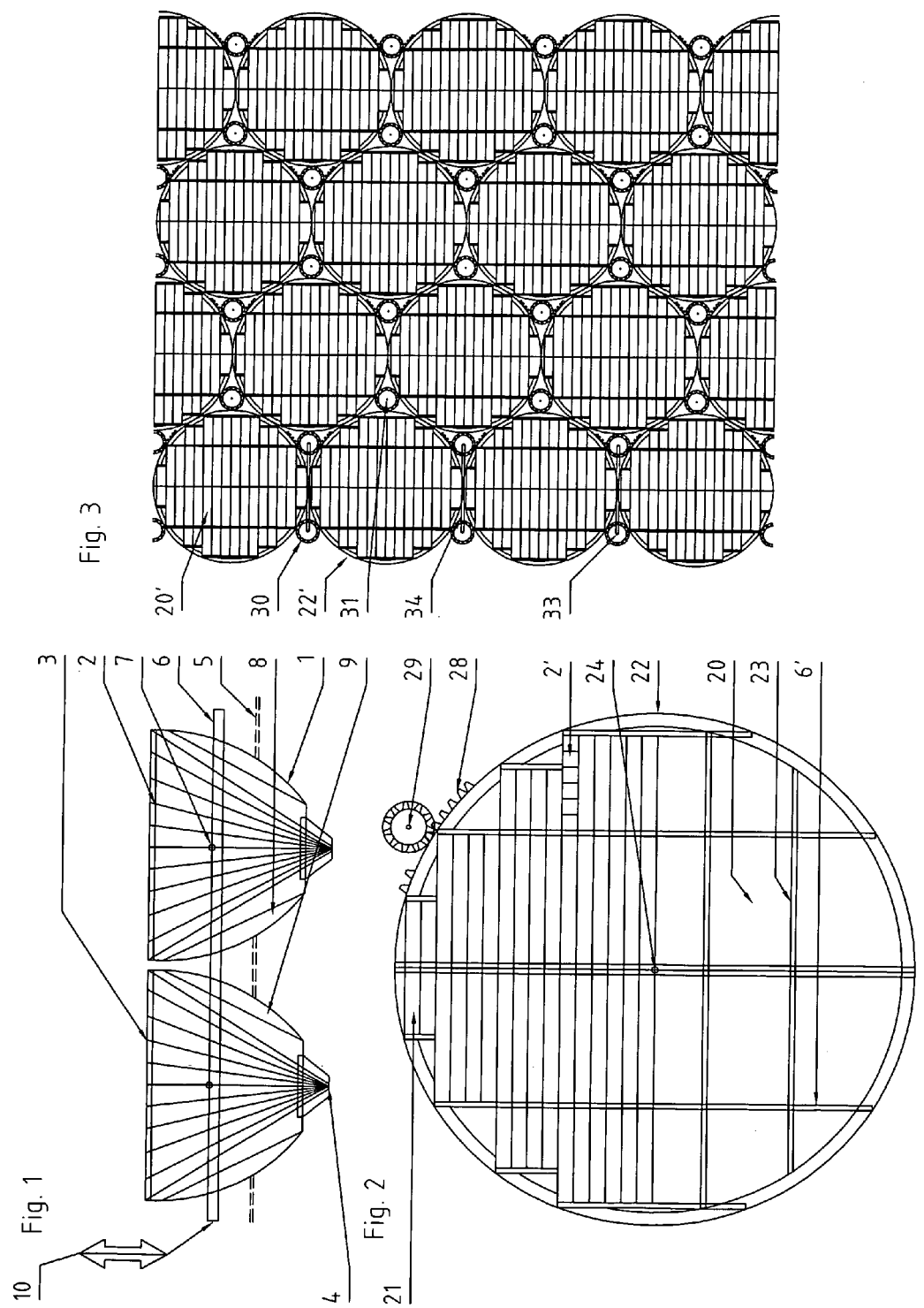

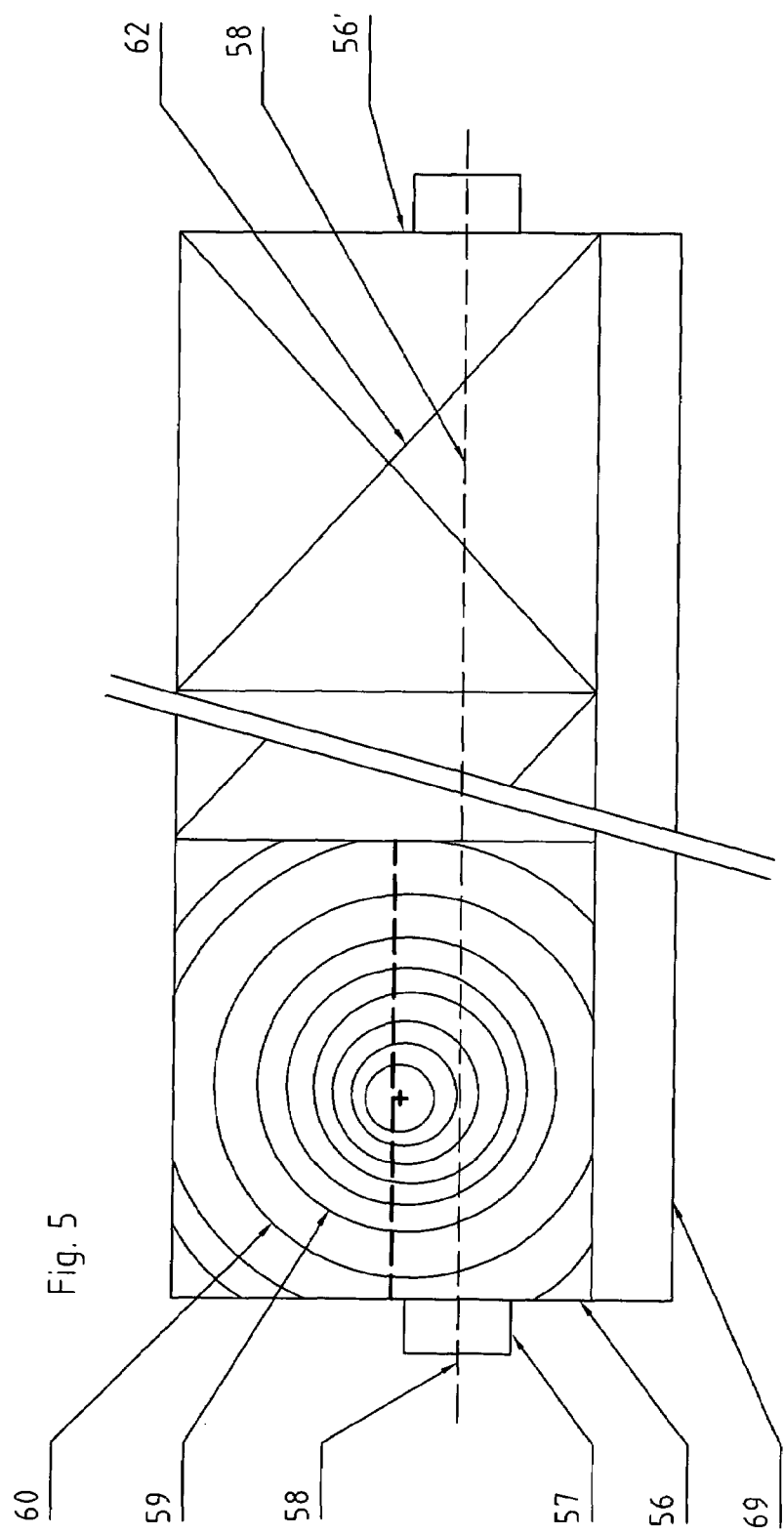

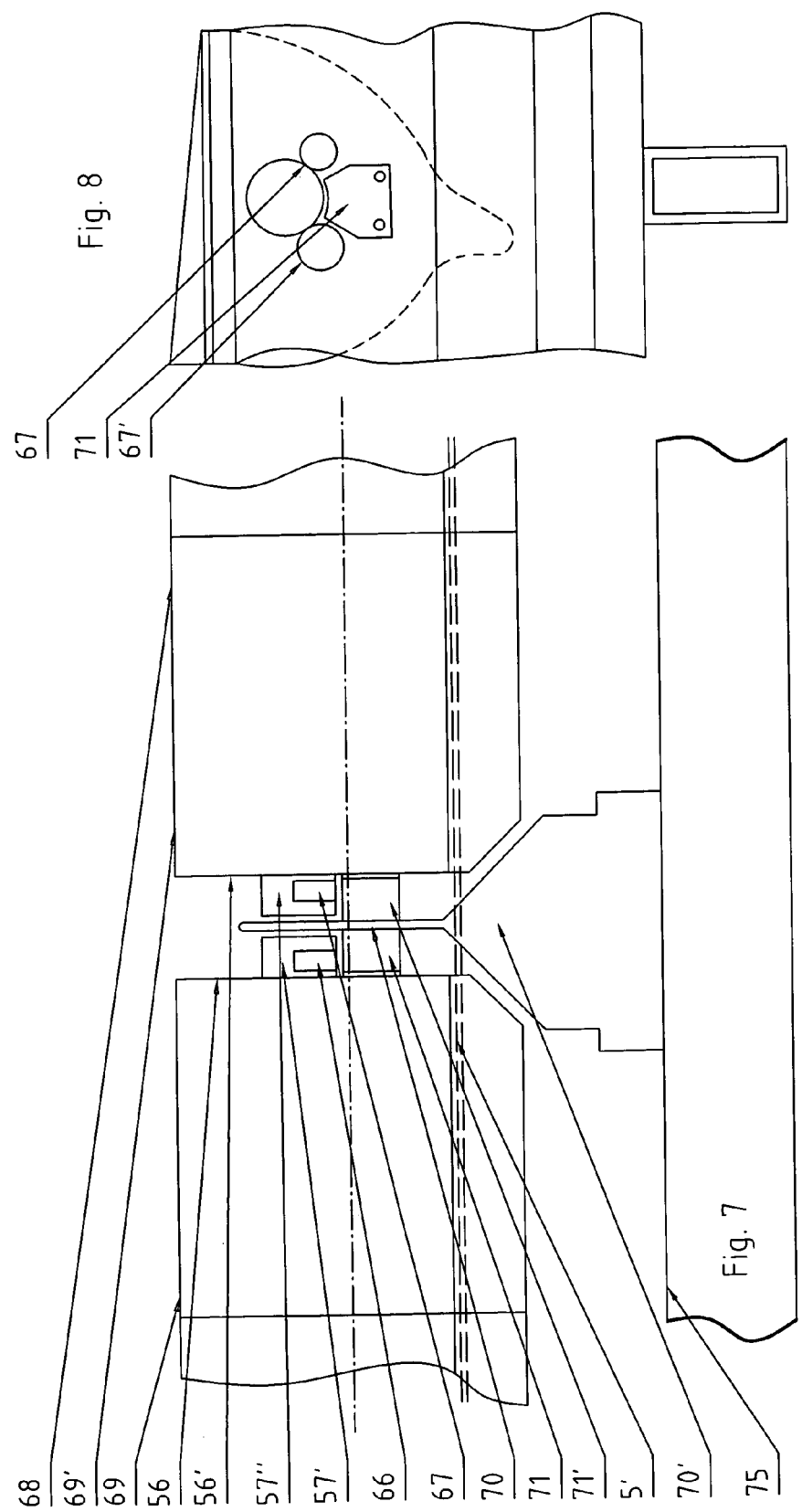

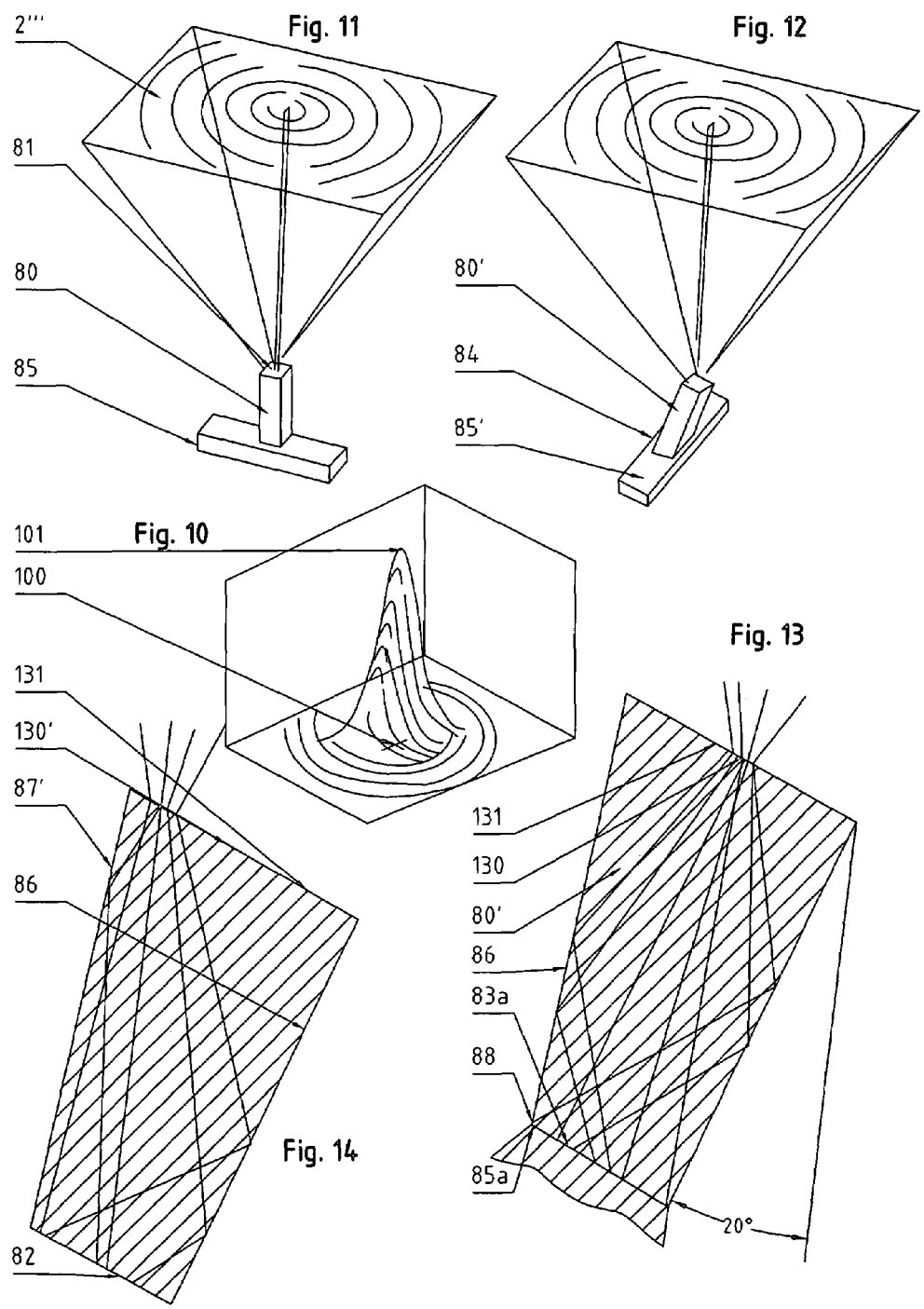

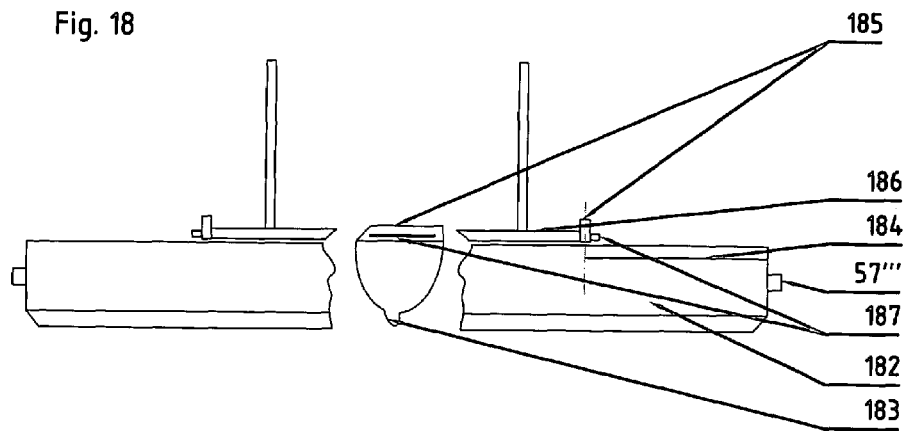
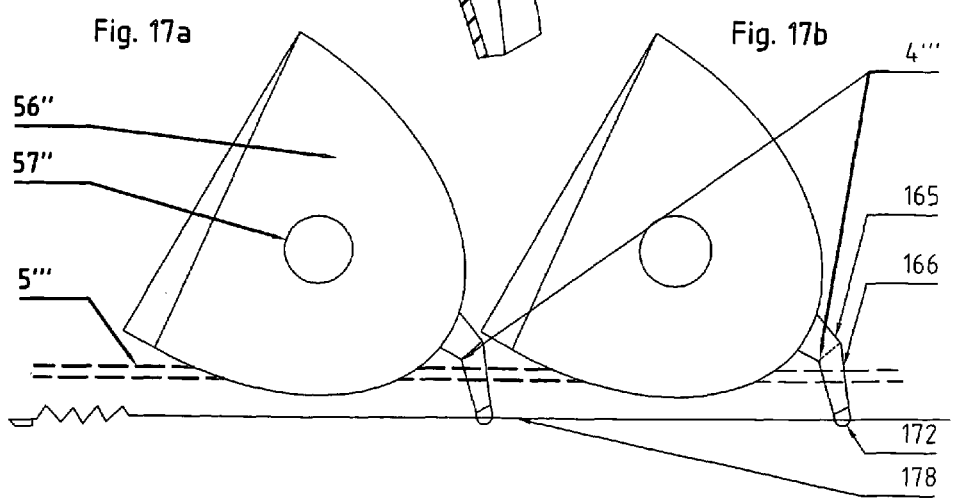

SOLAR ELECTRICITY GENERATOR

FIELD OF THE INVENTION

The invention refers to photovoltaic solar power plants of large size.

BACKGROUND OF THE INVENTION

The invention refers to devices for the direct conversion of solar energy into electricity, in contrast to indirect conversion involving elevated-temperature intermediary processes producing mechanical torque that is applied to rotary electrical generators. Large solar electricity generators are known to be currently operating in California. All of the largest first concentrate sunlight into high-temperature heat and thereafter, with methods known from combustion-heated power-stations, partially into electricity, the rest waste heat. All currently operating solar power plants with utility-significant electrical-output cover huge tracts because their areal yield is below 3%. Their high cost and considerable height lead to wide east-west separation of concentrator modules. Their high cost is due to the masses of metal required for the wind-loads generated by the height, while the height, ironically enough, is required in order to extend the number of hours per day that each module operates without being shadowed by its southern neighbors. Additional cost factors accrue from the high maintenance labor involved in solar thermal electrical generation.

Large-scale photovoltaic plants have only recently become economically viable due to the steadily decreasing photovoltaic-cell costs and steadily increasing cell efficiency. But without concentration, covering huge tracts of land with banks of one-sun cells will result in large masses of exotic metals being deployed across the landscape, necessarily in large panels that require their own wind-resistant structures. The present invention offers great improvements over this prior art, due to the efficiency-advantages of concentrating sunlight on PV cells.

Theoretically, some photovoltaic cells could convert nearly 50% of the irradiation directly into electricity, and practically nearly 40% has already been achieved in laboratory tests, but both of these are for solar concentration. The prior art of solar concentration, however, leads back to the same excessive land utilization, due to the requirement for modules to be separated. The air-cooled PV concentrators of the prior art are still expensive enough as to require all-day operation for practical payback, because their concentrations are only in the tens.

The prior art suffers from impractically excessive land utilization, which is expressed by their low areal solar efficiency, defined as electricity out divided by sunlight hitting all the land needed by the installation. The present invention offers an environmentally benign system of solar electricity generation that improves upon the aforementioned prior art with a compact, maintainable, resource-modest design that is easy to manufacture and install. By covering 87% of the set-aside land rather than 5%, far less acreage must be set aside per billion watts produced. The present invention offers highly scalable, compact solar-electricity installations with improved logistics of installation, maintenance, and control and improved economics of manufacturing and payback.

SUMMARY OF THE INVENTION

The invention therefore uses concentrated photovoltaic conversion of sunlight, in two-axis tracking of its direct component, optically focused to high concentration (about 400 in the preferred embodiment described herein) and kept to high efficiency by integral water cooling.

As disclosed further, the following measures are taken to approach levels of areal efficiency an order of magnitude above the prior art.

1. The optically active aperture will be a large fraction (near 90% areal utilization) of the ground surface. A novel two-axis tracking configuration is herein disclosed that attains this.
2. The irradiation on the photovoltaic cells will be several hundred suns, for operating efficiency to approach ideal limits, but not so high (thousands of suns) as to shorten reliable lifetime.
3. The conversion will be performed by multi-junction cells, because their component layers can each specialize in a portion of the solar spectrum, which is the underlying reason for the aforementioned high ideal conversion efficiencies.
4. The highly non-uniform distribution of concentrated flux at the small round focal spot (thousands of suns) will be distributed more equably over the larger, square photovoltaic cell. Because lens focal length varies with wavelength, the focal spot is spectrally non-uniform as well, with substantially wider focal spots at 400 nm and 1100 nm, than at the flux-weighted median refractive index of 1.492. Series-connected multi-junction cells, however, work best when the entire cell has the same spectral balance of concentrated solar flux received.
5. Because efficiency declines with temperature elevation, there will be a heat sink to remove fierce levels of unconverted solar heat, effective enough that the temperature difference between the bottom of the photovoltaic cell and the heat sink is only a few ° C. At hundreds of suns, this means water cooling.
6. Two-axis tracking of the direct component of solar-radiation will be cost-effectively implemented while retaining low overall height.

A further requirement for competitive large-scale solar electricity production is the enhanced cost-effectiveness over prior-art solar-energy conversion systems. The present invention makes this possible by:
   a) Reduced material mass per watt, by using the buoyancy of the concentrators to support horizontal tracking by floating on the cooling water,
   b) Minimal height of the system (literally knee-high) so that there is little vulnerability to the extremes of wind,
   c) Use of small photovoltaic cells, for which the transfer of the solar electricity requires only short leads to a low-resistance common bus.
   d) Short focal-length concentrating lenses and kaleidoscopic mixing rods, combined with natural-convection water-cooling, assure optimal cell-operation.

The invention fulfills all these requirements by the measures described in the claims.

BRIEF DESCRIPTION OF THE DRAWINGS

FIG. 1 shows a cross-section through two troughs
FIG. 2 shows a top-view of the skeleton of a platform.
FIG. 3 shows part of a solar farm.

FIG. 5 shows the view of a trough from above.

FIG. 7 shows the suspension of two troughs.

FIG. 8 shows the bearing for the troughs.

FIG. 10 shows the profile of the focal-area of a pencil of rays.

FIG. 11 shows the use of a radiation-homogenizer.

FIG. 12 shows the same arrangement with of a radiation-homogenizer.

FIG. 13 shows a radiation-homogenizer whose entrance plane is larger than its exit plane.

FIG. 14 shows the same radiation-homogenizer with eccentric focus

FIGS. 17a, 17b, and 17c show an elongated heat pipe.

FIG. 18 shows a lifting device for the troughs.

DESCRIPTION OF THE PREFERRED EMBODIMENTS OF THE INVENTION

Figure 6:
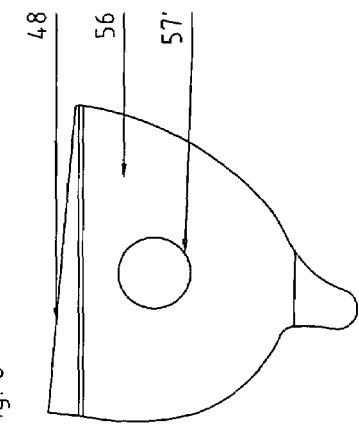
FIG. 6 shows an end wall of a trough.

FIG. 1 shows in schematic presentation a vertical section through concentrators positioned in troughs 1, covered by lenses 2 which concentrate parallel monochromatic rays 3 at focal spot 4. The troughs are supported on water body 5. The troughs are kept at a distance of only a few millimeters from each other by traverses 6. For tracking in solar elevation, the troughs can pivot around the horizontal geometric axis 7. The pivoting is controlled by sun-tracking sensors and is based on pneumatically driven balancing torques. By pumping water from ballast compartment 8 into ballast compartment 9, the two of which pneumatically inter-communicate via tube-shaped traverse 6, a buoyancy-torque makes each trough pivot upward to keep lens 2 aimed directly at the climbing sun, until it has reached its highest position at noon. Thereafter blower 10 creates positive pressure in ballast compartment 9 through traverse 6, so that water flows back from ballast compartment 9 into ballast compartment 8. This causes the trough during the afternoon hours to pivot the lens downward. The angle of traverse is proportional to the positive or negative pressure.

FIG. 2 shows skeleton 20 of a floating platform with multiple troughs 21, each comprising 12 concentrator lenses. The skeleton 20 comprises floating ring 22, which forms a unit with floating traverses 6' and vertically joins members 23 to traverses 6'. Vertical bearing 24 is arranged in the center of the platform and is connected to the ground. Ring 22 can have teeth 28 (as on a tooth-belt) that will be turned by disc 29, which is driven by an electric motor. The platform revolves around the vertical axis of the platform at the azimuthal angular velocity of the sun, controlled by a sun finder. Concentrating lenses 2' thus point at the sun in both horizontal and vertical axes. During the night the platform turns back into the morning position, but on breezy nights with the troughs aimed into the wind for enhanced cooling of the water.

FIG. 3 shows a group of platforms of a solar farm arranged in a close-packed manner suitable for any number of platforms. In such a case of multiple platforms, azimuthal tracking drive will be done by pneumatic-tire guiding-wheels 30 arranged interstitially between three platforms. Each fifth such wheel 31 is driven by an electric motor, the torque of which is transferred to outer rings 22'. Also in this case the rings 22' can have teeth to engage the teeth of guides 30. Footbridges 34 run above guides 30 to allow personnel access for maintenance. Below each platform 20' of the solar farm there is a shallow body of water, upon which it floats. This enclosed pond is protected from evaporation by layer of oil atop it. Into this water layer the waste heat of the photovoltaic cells is conducted. The cooling of the water layer is done by its exposure to the outside air. During hours when the sun is too low, and especially at night, platform 20 will be turned so the trough rows face into the direction of the wind, giving it good access to the pond water.

Such a solar farm can also be placed on natural bodies of water. If the bottom of a lake is too deep, the axes 33 of the guiding wheels 30 will be connected to each other by rods and the combined guiding wheels 30 will be attached via anchor apparatus to the bottom. Also, numerous industrial installations have large aeration ponds suitable for dual use with the present invention, as long as the troughs are made of a low-corrosion material.

Figure 4:
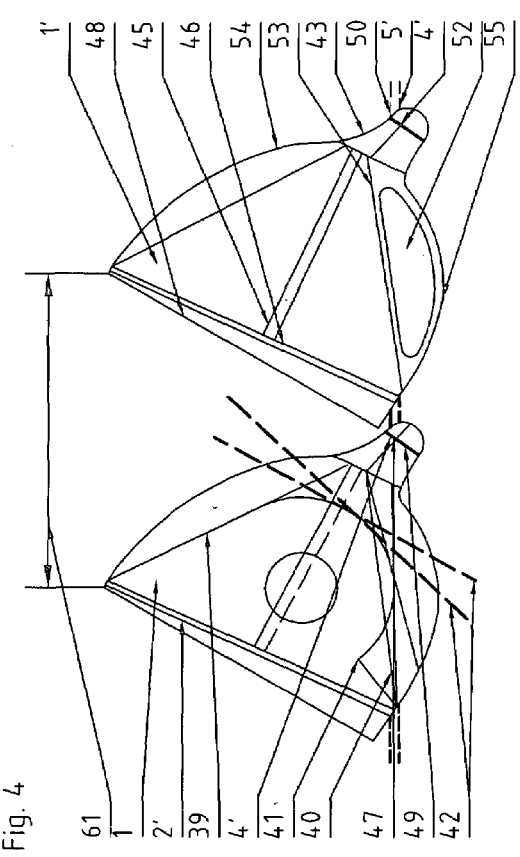
FIG. 4 shows the position of two troughs at low sun elevation.

FIG. 4 shows troughs 1 In transverse cross-section, to show their interiors, where the conversion of the sun's irradiation takes place. These troughs float on water layer 5 At low sun elevations trough 1' displaces an amount of water defined by dotted line 40 and those portions of trough-walls 54 lying below it. At each elevation angle geometric circle 41 has tangent to the plane of the water surface. Dotted lines from 40 through 42 define that plane at higher solar elevations, all of them tangent to circle 41. The distance 61 of the troughs 1 and 1' from each other results from the width of the lenses 2" plus a gap of minimal width between the troughs. At elevation angle shown of 24°, rim 47 of protruding guard frame 48 touches the protruding part 49 of the adjacent trough. Relative to bisecting line 45, optical axis 46 of lens 2 is moved downwards. This optical axis intersects the center of the entrance plane of radiation-homogenizer 43. The highly concentrated pencil of concentrated solar rays will enter rod 43 and by loss-free total internal reflection make its way to photovoltaic cell 4'. Due to the kaleidoscopic action of these internal reflections, the spatial distribution of the sunlight on 4' will having become more even. Photovoltaic cell 4' is in good thermal contact with extruded rod 50, positioned to stay below water surface 5' at all solar-elevation angles of trough 1'. At one end, hose 52 opens to the outside air and on the other end it is closed. Wire grid 53 runs parallel to peripheral ray 39 and prevents hose 52 from entering the pyramid within rays 39 of the concentrator lens.

In response to meteorological increases in air pressure, hose 52 fills with outside air. This measure ensures that the compartment enclosed by lenses 2', walls 54 and 55, and the end wall always has the same air-pressure as the outside air, minimizing uncontrolled air-exchange with ambient To dry the air entering the interior, a recycling dessicator is provided in canister 37 on hose 52. Dry interior air is essential because multi-junction-cells are hygroscopic.

FIG. 5 shows a view of the trough from the side facing the sun. At end plates 56 and 56' the troughs have stub-shafts 57, and can be tilted thereupon around horizontal geometric axis 58. The position of the axis 58 is chosen for zero buoyancy-torque at all operational tilting angles. Lens 2' has on its inner side a multiplicity of refracting grooves 59 in the central half of the lens and peripherally about it are TIR grooves 60, enabling the short focal length required by such a zero-torque trough-shape. As shown In FIG. 4, only with such a short focal length, as represented by dotted line 46, can inter-trough distance 61 be barely larger than the trough's width, for close to 100% fill-factor. Since the troughs are supported by floating in water, their walls need less material thickness than would be necessary to prevent twist deformation when out of the water. In order to save on the expense of corrosion-resistant wall material, diagonal bracing wires 62 form an 'X' on each lens, ensuring trough stiffness, which is required for all the homogenizer rods to line up on their respective foci.

Up to twelve Lens-Rod-Cell-Units are installed per trough. Guard-frame 48 in FIG. 4 prevents lens 2" from submerging in water-surface 5' at the lowest solar elevation FIG. 6 shows a view on the end plate 56 of a trough with guard-frame 48 and stubshaft 57'.

FIGS. 7 and 8 show two troughs with end plates 56 and 56' with stub-shafts 57" which are supported by ball-bearings. Wall 70 projects between end plates 56 and 56', and ball bearings 66 and 67 are mounted on it, as well as electricity collectors 71 and 71'. Wall 70 is part of extruded tube 70', most of which lies below water surface 5'. This tube 70' creates a buoyancy force that is transferred via ball bearings 66 and 67 to stub shafts 57' and 57", thereby supporting troughs 69 and 69'. Extruded tubes 70' are connected to platform-ring 22' of FIG. 1 via supports 75.

FIG. 8 shows extruded tube 70' running perpendicular to longitudinal axis 58 (FIG. 5) of the troughs. At wall 70, ball bearings 67 and 67' and electricity collectors 71 and 71' are positioned.

Figure 9:
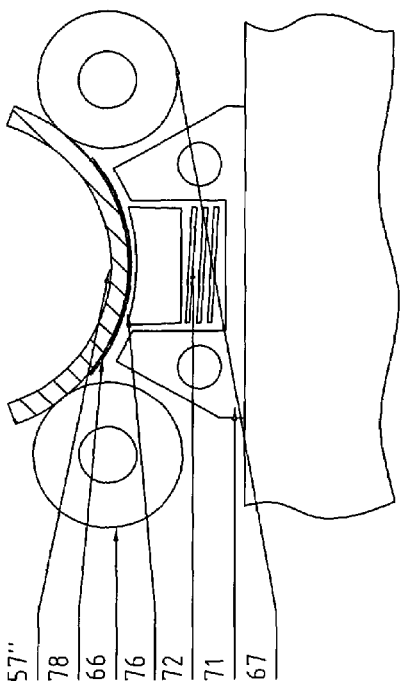
FIG. 9 shows the electricity collector.

FIG. 9 shows a cross-section through stub-shaft 57" with ball bearings 66 and 67 and electricity collector 71, in which contact-body 76 is pressed against slide-ring end 78 by spring 72. Slide-ring end 78 needs to extend only an angle at the center of about 70°, so that the weight of the trough on contact body 76 keeps it in firm contact with slide-ring end 78 at all angles of elevation. The slide-ring ends are series-connected with photovoltaic cells 4'(FIG. 4) so that opposite electric polarities are attained at opposite ends of the trough. Depending on the desired trough output-voltage, the multiple photovoltaic cells can be connected in series for the highest voltage or in parallel for hydrogen-hydrolysis or a combination of both for intermediate voltages. Similar series-parallel choices will determine how trough voltages combine for a desired platform voltage, when the power is conducted to the outside via a highly flexible cable.

The key component of radiation-homogenizer is described in FIGS. 10 to 14.

FIG. 10 is intensity plot 100 of the focal spot of the concentrating lens, with peak 101 of many thousands of suns and the remaining cell area dark. Such excess flux density will destroy the cell. Instead, a uniform distribution across the cell will result in 460 suns of geometric concentration, near the cell optimum.

FIG. 11 depicts radiation-homogenizer rod 80 receiving at end 81 the focused radiation of lens 2. Radiation-homogenizer rod 80 is made of glass of the highest volume transmissibility across the operational solar spectrum, to minimize absorptive heat loads therein. Most common glasses have solar absorption bands sufficiently dense as to add an unacceptable heat load to the cell. FIG. 12 shows a side view of the same, with slanted side 84 of rod 80 extending to thermally conductive heat-sink bar 85. This slant is necessary to keep bar 85 submerged at all solar elevation angles.

FIGS. 13 and 14 show radiation-homogenizer 80 with walls 86 and 87 and 87'slanting inward towards bottom surface 82. FIG. 13 shows rays at middle 130 of entrance plane 131, while in FIG. 14 rays off center. Exit surface 82 is in optical contact with photovoltaic cell 83 via optical-adhesive layer 83a. The lower side of photovoltaic cell 83 is connected to metal layer 85a of a material of thermal expansion coefficient close to that of the cell. This metallic layer is soldered to heat sink 88 before the cell and rod are bonded to it.

Figure 15:
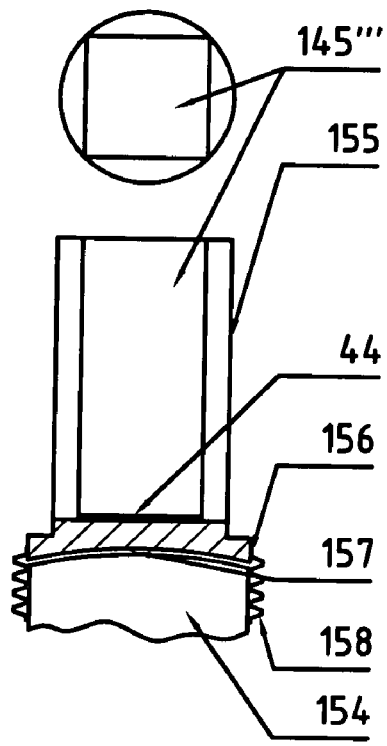
FIG. 15 shows the heat dissipation from a movable radiation-homogenizer by liquid metal.

This same optical device, the homogenizing rod, performs three functions:
a) Loss-free redistribution over the rectangular exit surface of the highly nonuniform concentrated solar radiation flux, which forms a circular spot on the entry surface.
b) Loss-free deflection of the total radiation flux by tilting the rod up to 20° about its entry face, in order to keep the heat sink submerged.
c) Providing an expanded entry surface (30% wider than the cell) large enough to collect all the focused sunlight even at a 1° error in elevation tracking FIG. 15 shows the arrangement in which radiation-homogenizer rod 145''' is enclosed by tube 155, which makes sole contact to rod 145''' via sharp edges that scatter very little concentrated sunlight Tube 155 is connected to metal base 156, which forms narrow gap 157 with heat sink 154. Gap 157 is filled with mercury, a supply of which is in bellow 158.

Figure 16:
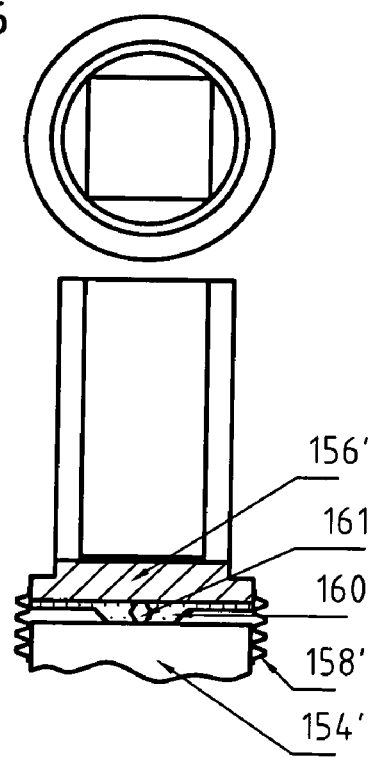
FIG. 16 shows the heat dissipation by a heat pipe.

FIG. 16 shows an evacuated heat pipe surrounded by bellow 158'. Wick 160 absorbs condensate fluid. Spacer 161 prevents heat absorbing planes 156' and 154' from being moved together by outside air pressure.

FIG. 17a shows a side-view of a trough with the stub-shaft 57'''. Photovoltaic cell 4'''is placed in protrusion 165 and is in thermal contact with heat pipe 166, the longitudinal extension of which runs perpendicular to endplate 56" down the entire length of the trough, from its first photovoltaic cell to the last. FIG. 17c shows absorbent wick-layer 167 positioned within heat pipe 166, from whose section 169 the heat transfer fluid, for instance water, evaporates. The vapor flows through compartment 170 to wall 171 which stays below water surface 5''' at all operational solar-elevation angles. At this wall the heat transfer fluid condenses and will be conveyed by capillary forces of wick-layer 167 back to photovoltaic cell 4''' and its waste heat. Heat pipe 166 is air-tight and evacuated except for a small amount of water.

FIG. 17b shows a second trough, which like the first can be tilted down to an elevation angle of 20°.

As an alternative to the aforementioned pneumatic tracking, FIGS. 17a and 17b, show a mechanical method for collectively tilting the lens-photovoltaic-units.

In FIGS. 17a and 17b, heat pipes 166 of the troughs have eyelets 172 at which rope 178 is fixed. In order to tilt the troughs around their horizontal axis to lower elevation angles, rope 178 will be moved by a linear motor in the direction of arrow 180. The adjusting force for a tilting to higher elevation angles comes from the screw-springs 181 which are connected to the platform skeleton.

FIG. 18 shows a trough in longitudinal view 182 and cross-sectional view 183. At a distance 184 of about a quarter of the total length a handle 185 is positioned. Via a crane, not shown, the rectangular tube 186 will be lowered between the two handles 185. Thereafter tongues 187 extend from the tube 186. Now the trough with the stab-shafts 57''', whose torsion rigidity is low since it normally floats on water, can be lifted out of its bearings as shown in FIG. 9.

The invention claimed is:

1. A two axis tracking solar electrical generator comprising a concentrator for sun rays; and a homogenizer, wherein the concentrator forms a pencil in which the rays are concentrated onto a small area on an entrance surface of the homogenizer which on its opposite surface is attached to a photovoltaic cell whereby said entrance surface of the homogenizer is so large that the concentrated rays still reach the photovoltaic cell even when the tracking has an error of 1 degree.

2. A two axis tracking solar electrical generator system according to claim 1, wherein the concentrator concentrates sunlight to thousands suns onto the entrance surface of the homogenizer from where it is loss-free redistributed over the rectangular exit surface of said homogenizer with a reduced concentration of about 400 suns.

3. A two axis tracking solar electrical generator system according to claim 1 with horizontally extending banks of linear troughs containing target means, which are partly submerged in a body of water.

4. The system of claim 1 with a concentrating lens, which has on its central portion refracting grooves and on its peripheral portions grooves with total internal reflection, enabling a short focal length.

5. A two axis tracking solar electrical generator comprising a concentrator for sun rays; and a homogenizer, wherein the concentrator forms a pencil in which the rays are concentrated onto a small area on an entrance surface of the homogenizer which on its opposite surface is attached to a photovoltaic cell whereby said entrance surface of the homogenizer is so large that the concentrated rays still reach the photovoltaic cell even when the tracking has an error of 1 degree, wherein the generator further comprises a photovoltaic cell and heat dissipating means, whereby between the photovoltaic cell and the heat dissipating means a metal layer of a material is positioned which has a thermal expansion coefficient close to that of the photovoltaic cell.

6. The system of claim 3 wherein said homogenizer has a first transverse face to receive said concentrated solar radiation, multiple longitudinally oriented planar walls to kaleidoscopically mix said radiation via total internal reflection, and a second transverse face opposing said first transverse face, said second transverse face being in optical contact with said photovoltaic cell.

7. The system of claim 6 wherein said optical contact comprises a transparent adhesive.

8. The system of claim 6 wherein said homogenizer has a longitudinal axis defining longitudinal walls, said longitudinal walls of sufficient length to mix said concentrated solar radiation both spatially and spectrally, said mixing sufficiently thorough so as to improve the radiant-utilization performance of said photovoltaic cell relative to its performance when receiving said concentrated solar radiation directly.

9. The system of claim 8 wherein said longitudinal axis of said homogenizer is tilted with respect to the direction of said concentrated solar radiation.

10. The system of claim 9 wherein said tilt is in a downward direction, said downward direction defined during tracking-operation at the lowest solar altitude.

11. The system of claim 8 wherein the first transverse face of said homogenizer is perpendicular to said longitudinal axis of said homogenizer.

12. The system of claim 8 wherein said homogenizer is made of glass.

13. The system of claim 7 wherein said homogenizer is a parallelepiped.

14. The system of claim 8 wherein at least one of said longitudinal walls is not parallel to said longitudinal axis, so that said homogenizer tapers in the direction of said concentrated solar radiation.

15. The system of claim 12 wherein said glass material exhibits low volume-absorptivity of solar radiation.

16. The system of claim 12 wherein said glass homogenizer has polished surfaces.

17. The system of claim 16 wherein said glass homogenizer has an anti-reflection coating on the transverse face receiving concentrated solar radiation.

18. The system of claim 12 wherein associated with said homogenizer are structural support means making only point or line contacts with said homogenizer.

19. The system of claim 18 wherein said structural support means comprises a tube with internal diameter equal to the diagonal dimension of said homogenizer.

20. The system of claim 15 wherein said homogenizer has a solar-reflective coating on wall-portions adjacent to said photovoltaic cell.

21. The system of claim 3, wherein said water is covered by an anti-evaporative means comprising a thin layer of an immiscible fluid of lower density than water, said fluid having sufficiently low vapor pressure for practical periods of persistence.

22. The system of claim 3, wherein said heat-removal means comprises a heat pipe in thermal contact with said water.

23. The system of claim 3, wherein buoyancy-balancing weight and a buoyancy-balancing torque about said shafts is exerted by distributed weights positioned eccentric to the center of gravity of said linear troughs.

24. The system of claim 3, wherein torque about said shafts is exerted by the weight of water within multiple chambers within said linear troughs, said chambers with controllable water-level, said chambers formed within said trough by longitudinal walls running parallel to said U-shaped lateral wall.

25. The system of claim 24 wherein said water-bearing chambers are arranged in pairs on opposing sides of said trough, the chambers of said pair connected by a water-bearing pipe.

26. The system of claim 25 wherein said contained water can be transferred between said paired chambers.

27. The system of claim 24, comprising means of transferring air between said chambers.

28. The system of claim 27 wherein said air-transfer means comprises an air-blower and pipes connecting said blower to the upper portions of said chambers.

29. The system of claim 24, including solar-tracking means comprising solar-altitude sensing apparatus and apparatus for generating appropriate control signals for said air-blower.

30. The system of claim 3, wherein said troughs comprise a bellows system to equalize interior and exterior air pressure.

31. The system of claim 1, whereby the area of the concentrated radiation on the surface of the first entrance face is so small that said area can move over said entrance face parallel to that surface in all directions.

* * * * *